(12) United States Patent
Ghosh (10) Patent No.: US 6,888,172 B2
(45) Date of Patent: May 3, 2005

(54) APPARATUS AND METHOD FOR ENCAPSULATING AN OLED FORMED ON A FLEXIBLE SUBSTRATE

(75) Inventor: Amalkumar P. Ghosh, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/412,004

(22) Filed: Apr. 11, 2003

(65) Prior Publication Data

US 2004/0201027 A1 Oct. 14, 2004

(51) Int. Cl.$^7$ ............................................. H01L 33/00
(52) U.S. Cl. ..................... 257/99; 257/100; 257/101; 257/102; 257/103; 257/43; 257/44; 257/42; 438/26; 438/28; 438/126; 438/116; 438/127
(58) Field of Search ......................... 257/99, 100, 101, 257/443; 34/61, 476; 313/504, 506

(56) References Cited

U.S. PATENT DOCUMENTS 5,693,956 A * 12/1997 Shi et al. ..................... 257/40
6,150,187 A * 11/2000 Zyung et al. ................. 438/26
6,284,393 B1 * 9/2001 Hosokawa et al. ......... 428/690
6,393,716 B1 * 5/2002 Chang et al. .................. 34/61
6,597,111 B2 * 7/2003 Silvernail et al. ........... 313/506
6,624,568 B2 * 9/2003 Silvernail .................... 313/504
6,677,709 B1 * 1/2004 Ma et al. ..................... 313/504
6,734,622 B1 * 5/2004 Kanitz et al. ............... 313/504
2002/0022156 A1 * 2/2002 Bright ......................... 428/698
2002/0108267 A1 * 8/2002 Chang et al. ................. 34/476
2003/0052327 A1 * 3/2003 Kwasnick et al. .......... 257/103

FOREIGN PATENT DOCUMENTS

WO  WO 01/82390  11/2001

* cited by examiner

Primary Examiner—Nathan J. Flynn
Assistant Examiner—Fazli Erdem
(74) Attorney, Agent, or Firm—Raymond L. Owens (57) ABSTRACT

An apparatus and method are disclosed for encapsulating an OLED device formed on a flexible substrate. The OLED device is moisture protected by an encapsulation which sandwiches the OLED device between two transparent dielectric metal oxide layers. The oxide layers are formed in a chamber which includes a plurality of processing stations for forming successive atomic layers of oxides along passes of the flexible substrate within the chamber.

11 Claims, 8 Drawing Sheets

APPARATUS AND METHOD FOR ENCAPSULATING AN OLED FORMED ON A FLEXIBLE SUBSTRATE

FIELD OF THE INVENTION

The present invention relates to an apparatus and method for providing moisture protection of an OLED device that is disposed on a flexible substrate. More particularly, the moisture protection is provided in the form of transparent dielectric layers that encapsulate the OLED device.

BACKGROUND OF THE INVENTION

Organic light-emitting diode (OLED) devices, also referred to as organic electroluminescent (EL) devices, have numerous well known advantages over other flat-panel display devices currently in the market place. Among these advantages is brightness of light emission, relatively wide viewing angle, and reduced electrical power consumption compared to, for example, liquid crystal displays (LCDs).

Applications of OLED devices include active matrix image displays, passive matrix image displays, and area lighting such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Recombination of holes and electrons within a zone of the EL medium structure results in emission of light from this zone that is, appropriately, called the light-emitting zone or interface. The emitted light is directed towards an observer, or towards an object to be illuminated, through the light transmissive electrode. If the light transmissive electrode is the lower or bottom electrode of the OLED device, the device is called a bottom-emitting OLED device. Conversely, if the light transmissive electrode is the upper or top electrode, the device is referred to as a top-emitting OLED device.

The organic EL medium structure can be formed of a stack of sublayers that can include small molecule layers and polymer layers. Such organic layers and sublayers are well known and understood by those skilled in the OLED art.

It is also well known that OLEDs are sensitive to moisture. If water molecules reach or penetrate an OLED device, the operational lifetime of such device can be reduced significantly.

One approach to increase the operational lifetime of an OLED device to acceptable levels is to reduce the adverse effects of moisture by positioning the device in a separate enclosure or package together with moisture absorbing desiccants, and to seal the enclosure so that moisture penetration into the enclosure is reduced or eliminated. Unfortunately, the cost of such moisture protective packaging is likely to constitute a substantial proportion of the total device cost, particularly as device size or device area increases.

Another approach to providing moisture protection of OLED devices has been proposed by Ghosh et al. in International Patent Application WO 01/82390 A1. In this disclosure, a plurality of spaced apart OLED devices are formed on a rigid substrate which is presumed to be impervious to moisture penetration.

An encapsulation assembly is disposed over the OLED devices and over at least a portion of the substrate. The encapsulation assembly includes at least two layers. A first layer can be a dielectric oxide layer, which is directly in contact with at least a portion of the rigid substrate, and a second layer is a polymer layer, which covers the first layer. Alternatively, it is proposed to provide a first polymer layer over the OLED devices and patterned to be in direct contact with the substrate around a device perimeter. A second layer of the proposed encapsulation assembly is a dielectric oxide layer in this latter configuration. Thus, Ghosh et al. provide moisture protection which is integral with an OLED device and, accordingly, does not require device sealing within or by a separate enclosure. It will be appreciated that the Ghosh et al. encapsulation assembly is disposed over OLED devices that are formed directly on a rigid substrate such as, for example, a glass plate or a silicon wafer.

It is anticipated that OLED devices having relatively large dimensions will be manufactured on a flexible substrate, also referred to as a web, in the form of passive matrix display panels for relatively large and low cost displays, or in the form of relatively large area illumination sources for selected lighting applications such as, for example, selective desk top lighting.

It is further anticipated that flexible substrates will include plastic-foil materials selected to provide adequate physical properties for the intended OLED applications, and at the lowest possible cost of such materials. Relatively low cost plastic flexible substrates, for example acrylic material foils, are known to be ineffective moisture barriers. Accordingly, OLED devices formed directly over such flexible substrates would be subject to moisture penetration and attendant reduction in operational lifetime, irrespective of moisture protection provided integrally over the OLED devices.

SUMMARY OF THE INVENTION

It is therefore an object of the present invention to provide a moisture protected OLED device having a flexible substrate.

It is another object of the present invention to provide an apparatus for forming a transparent moisture barrier layer over a flexible substrate, and for forming a transparent moisture protective encapsulation layer over OLED devices formed on the barrier layer.

It is a further object of the present invention to provide a method of forming a transparent moisture barrier layer over a flexible substrate, and of forming a transparent moisture protective encapsulation layer over OLED devices formed on the barrier layer.

In one aspect, these objects are achieved in a moisture protected OLED device, comprising:

a) a flexible substrate;

b) a transparent moisture barrier layer in direct contact with one surface of the substrate;

c) a first electrode layer formed over at least a portion of the moisture barrier layer;

d) an organic electroluminescent medium structure formed over at least a portion of the first electrode layer;

e) a second electrode layer formed over at least a portion of the electroluminescent medium structure;

f) a transparent moisture protective encapsulation layer formed over the second electrode layer and extending over a portion of the moisture barrier layer; and g) openings formed through the encapsulation layer to permit electrical connections to the first and second electrode layers of the OLED device.

In another aspect, one object of the invention is achieved in an apparatus for forming a transparent moisture barrier layer in direct contact with a flexible substrate on which can be formed an OLED device in a vacuum chamber, comprising:

a) a repeating series of stations including at least two spaced apart processing stations and an intermediate purging station disposed within the vacuum chamber between the two processing stations and wherein the two processing stations include different gases which react with the substrate to form a portion of the moisture barrier layer, the purging station having a purging gas disposed between the processing stations and directed to impinge upon the substrate to separate the two different gases in the processing stations;

b) means for moving the flexible substrate along a path in the vacuum chamber past the repeating stations; and c) means for controlling the operation of the repeating series of stations to form the moisture barrier layer on the substrate.

In a further aspect, one object of the invention is achieved in a method of forming a transparent moisture barrier layer in direct contact with a flexible substrate on which can be formed an OLED device, comprising the steps of:

a) providing a vacuum chamber;

b) disposing within the vacuum chamber a repeating series of stations including at least two spaced apart processing stations and an intermediate purging station disposed between the two processing stations and wherein the two processing stations include different gases which react with the substrate to form a portion of the moisture barrier layer, the purging station having a purging gas disposed between the processing stations and directed to impinge upon the substrate to separate the two different gases in the processing stations; and c) moving the flexible substrate along a path in the vacuum chamber past the repeating stations which form the moisture barrier layer on the substrate.

ADVANTAGES

It is a feature of the present invention that a plurality of laterally spaced moisture protected OLED devices can be fabricated economically along a length direction of a flexible substrate. It is another feature of the invention that individual moisture protected OLED devices can be readily cut from an elongated flexible substrate.

BRIEF DESCRIPTION OF THE DRAWINGS

FIGS. 5–8 are schematic side views of single moisture protected OLED devices formed over a transparent moisture barrier layer disposed on a flexible substrate and having a transparent moisture protective encapsulation layer, in which

DETAILED DESCRIPTION OF THE INVENTION

As used herein, the term "transparent" refers to a moisture barrier layer or to a moisture protective encapsulation layer and denotes an optical transmission of at least 90% of light directed perpendicularly at a surface of such layer. The term "light transmissive" refers to a flexible substrate or to electrodes of an OLED device and denotes optical transmission of between 50% and 85% of light directed perpendicularly at a surface of such substrate or electrode. The term "absorptive" refers to a light-absorbing flexible substrate or to an optically opaque flexible substrate which reflects less than 20% of light directed perpendicularly at a surface of such substrate. The term "reflective" refers to a reflective layer or to a reflective electrode of an OLED device and denotes an optical reflectance of at least 50% of light directed perpendicularly at such reflective layer or electrode.

Figure 1:
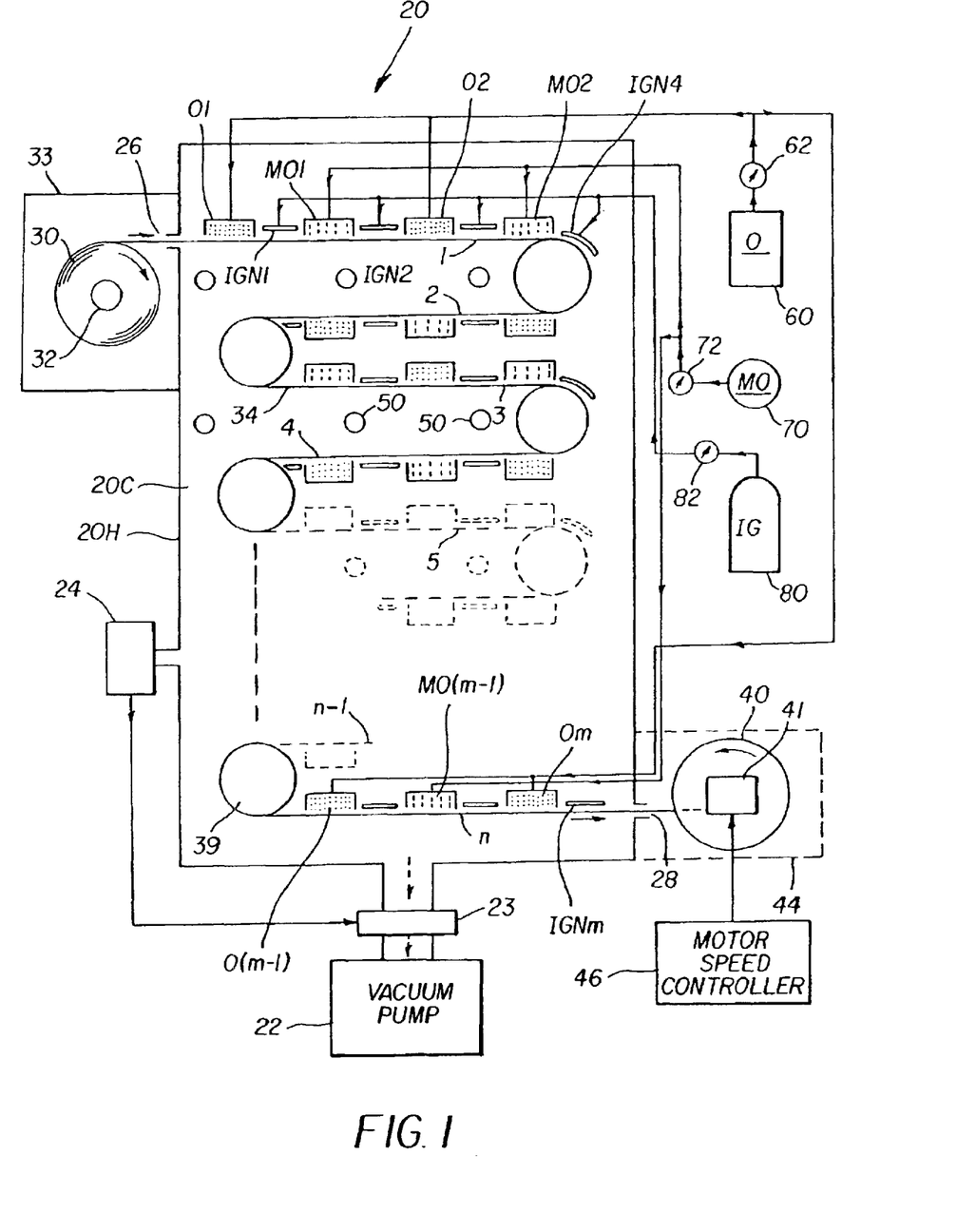
FIG. 1 is a schematic view of an apparatus for forming a moisture barrier layer on a flexible substrate or for forming a moisture protective encapsulation layer over an OLED device disposed on the barrier layer, in accordance with the present invention.

Turning now to FIG. 1, an apparatus 20 has a housing 20H which defines a chamber 20C. The chamber 20C is evacuated by a vacuum pump 22 via a vacuum pump control valve 23 which is controlled by a pressure monitor 24. The pressure monitor has selectable ranges of reduced pressure in the chamber 20C which permit initial evacuation of the chamber to a reduced pressure in a range from $10^{-5}$ to $10^{-6}$ Torr ($1.33 \times 10^{-3}$ to $1.33 \times 10^{-4}$ Pascal), so as to reduce moisture within the chamber to a level below 0.1 parts per million (ppm).

The housing 20H further includes an entrance port 26 and an exit port 28 through which a light transmissive flexible substrate 34 can enter and exit the chamber 20C. The flexible substrate 34 is provided on a supply reel 30 having a tension clutch 32. The supply reel is disposed in an enclosure 33 which can be maintained moisture-free by, for example, flow of an inert gas through the enclosure (not shown). The enclosure 33 can be sealingly positioned with respect to the entrance port 26. Similarly, an optional enclosure 44, shown in dashed outline, can be sealingly positioned with respect to the exit port 28 through which the flexible substrate 34 is wound on a take-up reel 40 driven by a take-up reel drive motor 41 under control of a motor speed controller 46.

The flexible substrate 34 is transported or moved within the chamber 20C along a plurality of substantially parallel passes 1, 2, 3, 4, 5, . . . n−1, n as defined by idler rollers 39 mounted on roller brackets (not shown). The number n of substrate passes between idler rollers is an integer such as, for example, an odd number selected between n=9 and n=29. A flexible starting leader (not shown) and a flexible trailing leader (not shown) can be attached to the flexible substrate 34. The chamber 20C includes an access door (not shown) which is in an open position for threading the starting leader from the supply reel 30 through the entrance port 26, around the idler rollers 39, and through the exit port 28 to the take-up reel 40. The chamber access door is then closed, and the chamber is evacuated to the initial value of reduced pressure.

A repeating series of stations is disposed in proximity to the flexible substrate 34 with respect to one and the same substrate surface and along each of the n substrate passes between idler rollers 39. Each series of stations includes a processing station for directing an oxidizing gas at the surface of the moving substrate so that surface sites of the substrate surface react with the oxidizing gas to form an atomic layer of oxygenated sites. Such oxidizing gas processing stations are identified as O1, O2, . . . O(m−1), Om, wherein m is an integer, and gas flow within these processing stations is depicted in dotted outline.

Each series of stations also includes a processing station for directing a metal-organic gas at the surface of the moving substrate so that previously oxygenated surface sites react with the metal-organic gas to form an atomic layer of a metal oxide. Such metal-organic gas processing stations are identified as MO1, MO2, . . . MO(m−1), wherein m is an integer, and gas flow within such processing stations is depicted in dashed vertical outline.

Each series of stations further includes a purging station, which is disposed between the spaced apart processing stations. The purging stations direct an inert purging gas to impinge upon the substrate surface so as to prevent mixing of the two different processing gases which may seep laterally from the processing stations. The inert purging gas can be nitrogen or argon. The purging stations are depicted in the form of inert gas nozzles, identified as IGN1, IGN2, . . . IGNm, wherein m is an integer.

When gas flow commences in the processing stations and in the purging stations, the reduced pressure in the chamber 20C will increase from the initial reduced pressure to an operational reduced pressure which can be in a range from $10^{-4}$ to $10^{-2}$ Torr ($1.33 \times 10^{-2}$ to 1.33 Pascal).

Heat lamps 50 are shown disposed between alternate substrate passes, and extending across the flexible substrate in a direction perpendicular to the direction of motion of the substrate. These heat lamps, also referred to as linear lamps, can heat the flexible substrate 34 to a desired temperature at which enhanced chemical reactions of the processing gases can be obtained on the substrate.

As shown only schematically in FIG. 1, an oxidizing gas supply 60 ("O") is connected via a pressure adjustment valve 62 and conduits (not identified in the drawing) to each one of the oxidizing gas processing stations. Likewise, a metal-organic gas supply 70 ("MO") is connected via a pressure adjustment valve 72 and conduits (not identified) to each one of the metal-organic gas processing stations. And an inert gas supply 80 ("IG") is connected via pressure adjustment valve 82 and conduits (not identified) to each one of the inert gas nozzles which comprise the purging stations.

The repeating series of processing stations disposed along the n passes of the flexible substrate provides for formation of successive atomic layers of a transparent metal oxide. The number of substrate passes between idler rollers and the number of series of repeating stations along each substrate pass are chosen to provide a desired thickness of a transparent dielectric metal oxide layer over the substrate surface at a selected speed of motion of the substrate provided by the take-up reel drive motor 41. An effective moisture barrier layer thickness, or an effective moisture protective encapsulation layer thickness can be in a range from 20 to 70 nanometer (nm).

In the case of aluminum oxide deposition, the preferred oxidizing gas is ozone. The oxidizing gas supply 60 can be an ozone generator and the preferred metal-organic gas can be trimethylaluminum (TMA).

Accordingly, a transparent dielectric oxide layer of aluminum oxide, silicon dioxide, aluminum titanium oxide, tantalum oxide, hafnium oxide, or zirconium oxide can be formed in the apparatus 20 on the flexible substrate, or as an encapsulation layer over an OLED device. Stated differently, a moisture barrier layer and moisture protective encapsulation layer can be formed of the same or different transparent dielectric metal oxides.

The process of forming such layers in the form of successively deposited atomic sublayers is well known to those skilled in the art of chemical vapor deposition, and is commonly referred to as atomic layer chemical vapor deposition (ALCVD). It should be noted that the use of ozone as an oxidizing gas to form metal oxide layers is just an example. There are potentially numerous other gases than can be used to form non-oxide dielectric layers.

Figure 2A:
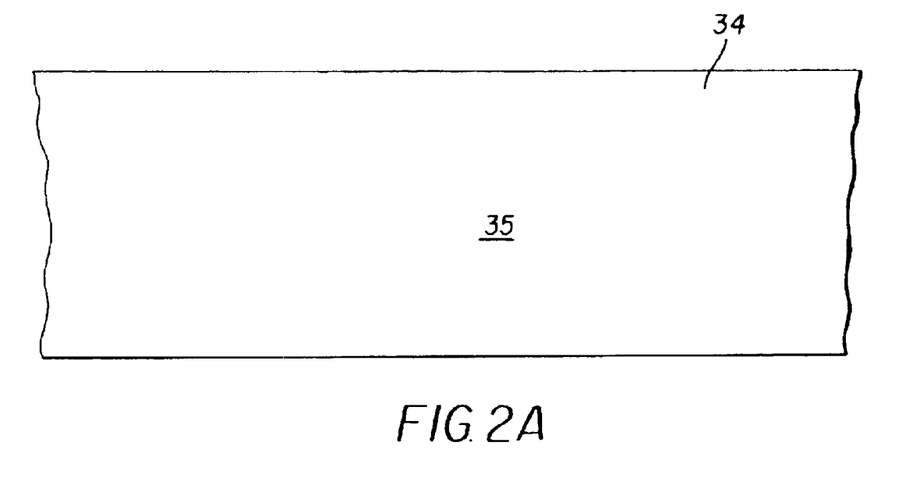
FIG. 2A is a schematic plan view of a portion of a light transmissive flexible substrate which has a transparent moisture barrier layer disposed over one substrate surface, in accordance with the present invention.

Turning to FIG. 2A, a portion of a light transmissive flexible substrate 34 is shown in a schematic plan view, and having a transparent moisture barrier layer 35 formed over one substrate surface in the apparatus 20 of FIG. 1.

FIGS. 2B–2E are schematic side views of portions of flexible substrates which include a transparent moisture barrier layer 35.

Figure 2B:
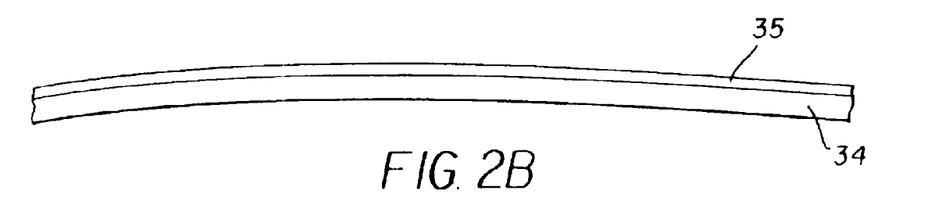
FIG. 2B is a schematic side view of the substrate of FIG. 2A.

FIG. 2B depicts a light transmissive flexible substrate 34, for example a light transmissive plastic-foil substrate.

Figure 2C:
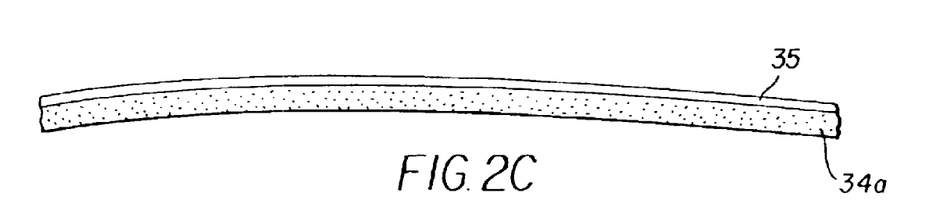
FIG. 2C is a schematic side view of an absorptive flexible substrate which has a transparent moisture barrier layer disposed over one surface, in accordance with an aspect of the present invention.

FIG. 2C indicates an absorptive flexible substrate 34a, which can be an absorptive plastic-foil substrate or a metal foil substrate having an optical reflectance of less than 20%.

Figure 2D:
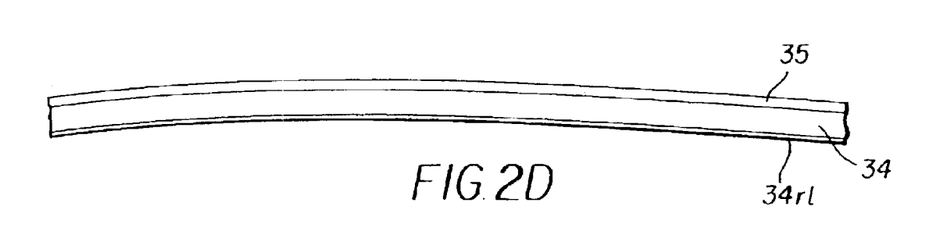
FIG. 2D is a schematic side view of a light transmissive flexible substrate which has a transparent moisture barrier layer disposed over one substrate surface and a reflective layer disposed over an opposing substrate surface, in accordance with another aspect of the present invention.

FIG. 2D shows a light transmissive flexible substrate 34 which has a reflective layer 34rl preformed on a lower surface of the substrate.

Figure 2E:
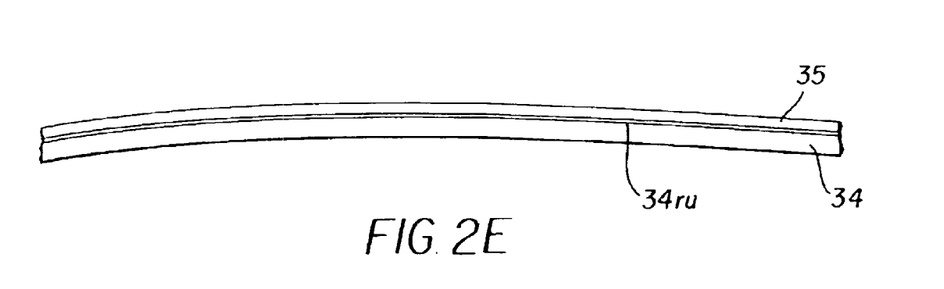
FIG. 2E is a schematic side view of a light transmissive substrate which has a reflective layer disposed over one substrate surface and a transparent moisture barrier layer formed over the reflective layer, in accordance with another aspect of the present invention.

FIG. 2E shows a light transmissive flexible substrate 34 which has a reflective layer 34ru preformed on an upper surface of the substrate, and the transparent moisture barrier layer 35 disposed over the reflective layer.

Figure 3A:
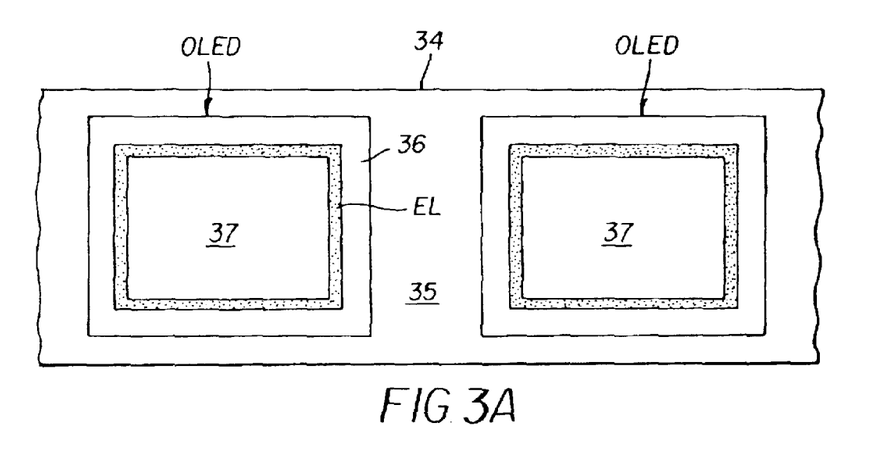
FIG. 3A depicts schematically a plan view of spaced apart OLED devices formed over a moisture barrier layer disposed on a flexible substrate, in accordance with an aspect of the present invention.
Figure 3B:
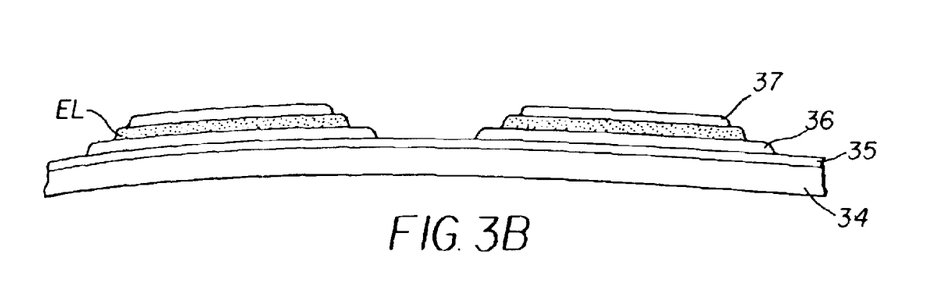
FIG. 3B is a schematic side view of the OLED devices of FIG. 3A.

Turning to FIGS. 3A and 3B, a schematic plan view and a schematic side view, respectively, show a portion of a light transmissive flexible substrate 34 having a transparent moisture barrier layer 35 formed on one surface in the apparatus 20 of FIG. 1.

Two OLED devices have been formed over the moisture barrier layer 35 by conventional vapor deposition using vapor deposition equipment and vapor deposition processes well known to those skilled in the art of making OLED devices.

Briefly described, a light transmissive first electrode layer 36 is formed over the transparent moisture barrier layer 35. The first electrode layer is depicted unpatterned to preserve visual clarity of the drawing. It will be appreciated that a first electrode layer 36 can be patterned to comprise a plurality of parallel and laterally spaced individual electrodes which can be individually addressed by electrical signals such as is common practice in a so-called passive matrix OLED display device.

An organic electroluminescent medium structure EL is depicted in dotted outline, and is formed over the first electrode layer 36. The EL structure can be a multilayer stack which includes a hole-injecting layer in contact with the first electrode layer 36 and, in sequence, a hole-transporting layer, a light-emitting layer, and an electron-transporting layer, such EL medium structure being well known in the art of OLED device layer configurations.

A light transmissive second electrode layer 37 is shown disposed over the EL medium structure. While the incorporation of light transmissive first and second electrode layers may at first glance appear to be redundant or superfluous, such light transmissive electrode layers do provide a basis for some OLED device configurations which might not be provided otherwise (see, for example, FIGS. 6–8).

The second electrode layer 37 is also shown as an unpatterned layer. It will be understood that a second electrode layer can be provided in a form of a plurality of laterally spaced and parallel individual electrodes which extend in a direction perpendicular to a direction of laterally spaced and parallel first electrodes, as is the conventional electrode configuration of a passive matrix OLED display device.

The outlines or peripheries of the first electrode layer 36, the EL medium structure, and the second electrode layer 37, respectively, are defined by so-called frame masks used conventionally in vapor deposition of OLED layers.

Figure 3C:
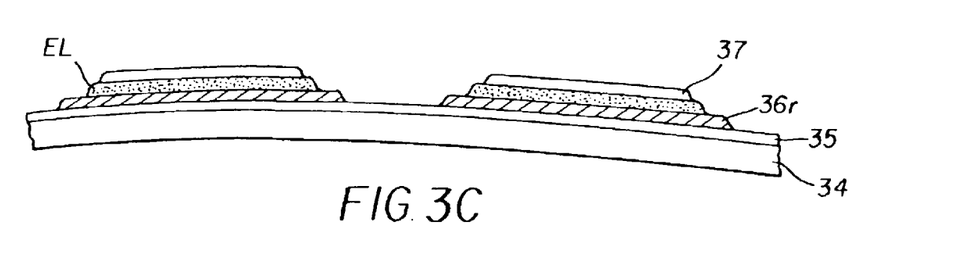
FIG. 3C is a schematic side view of the OLED devices which include a reflective first electrode layer and a light transmissive second electrode layer.

FIG. 3C is a schematic side view of OLED devices formed over the transparent moisture barrier layer 35 wherein a reflective first electrode layer 36r is provided, as indicated by diagonal shading.

Figure 3D:
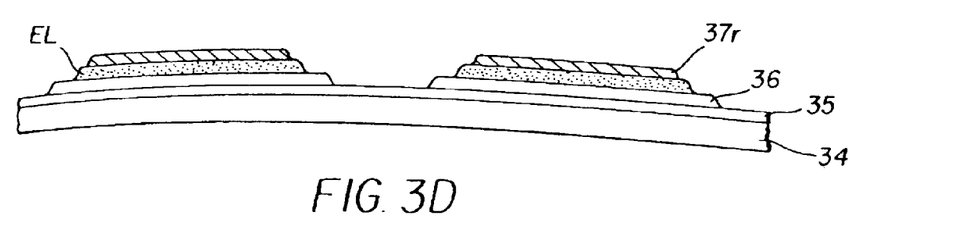
FIG. 3D is a schematic side view of the OLED devices which include a light transmissive first electrode layer and a reflective second electrode layer.

FIG. 3D is a schematic side view of OLED devices formed over the transparent moisture barrier layer 35 wherein a reflective second electrode layer 37r is provided, as indicated by diagonal shading.

Figure 4A:
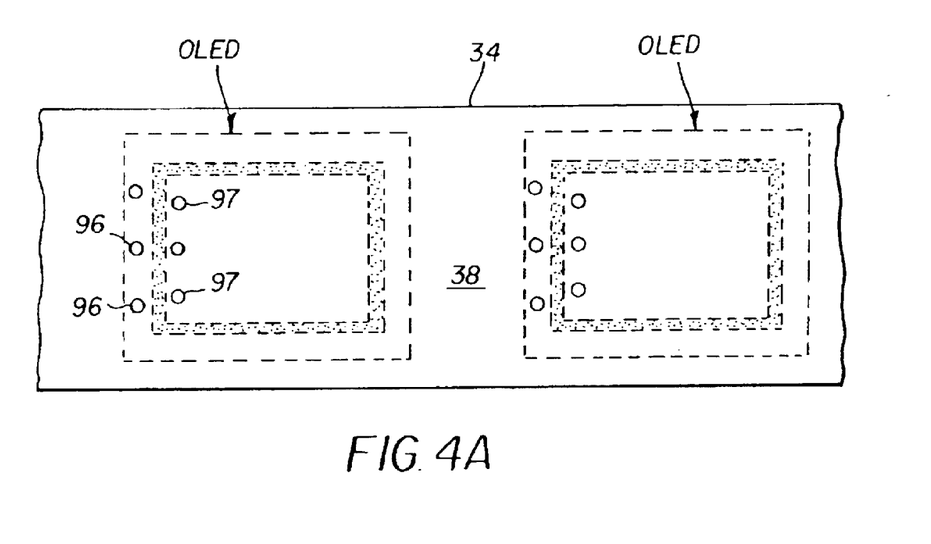
FIG. 4A is a schematic plan view of moisture protected OLED devices which are encapsulated by a transparent encapsulation layer extending over the OLED devices and over the transparent moisture barrier layer formed on the flexible substrate, in accordance with the present invention.
Figure 4B:
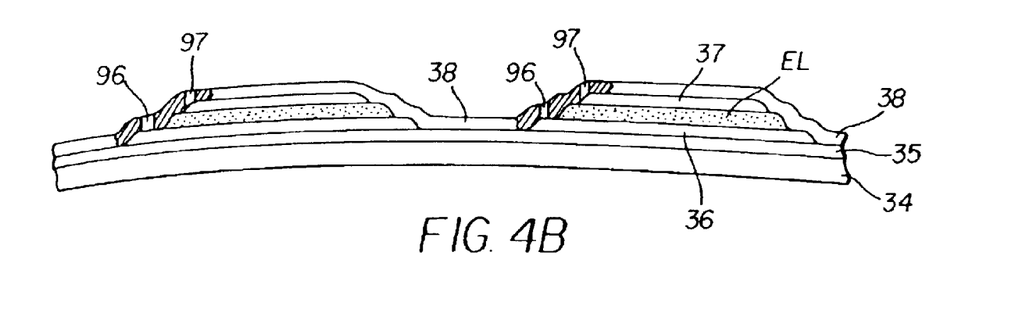
FIG. 4B is a schematic side view of the OLED devices of FIG. 4A and showing openings through the encapsulation layer for permitting electrical connections to the first and second electrode layers.

Turning to FIGS. 4A and 4B, a schematic plan view and a schematic side view are shown, respectively, of the OLED devices which have now been encapsulated with a transparent moisture protective encapsulation layer 38. This encapsulation layer can be formed in the apparatus 20 of FIG. 1 or in a different apparatus by the above described process of atomic layer chemical vapor deposition (ALCVD). Like the moisture barrier layer 35, the moisture protective encapsulation layer 38 can be formed of a transparent dielectric metal oxide material including aluminum oxide, silicon dioxide, aluminum titanium oxide, tantalum oxide, hafnium oxide, or zirconium oxide. It should be noted that the use of aluminum oxide is an example. Numerous other dielectric materials may be used such as $Ta_2O_5$, ATO (aluminum titanium oxide), hafnium oxide, silicon dioxide, zirconium, etc.

The encapsulation layer 38 is disposed over the OLED devices and over the moisture barrier layer 35 which had been formed over a surface of the flexible substrate 34. Thus, the combination of the moisture barrier layer 35 and the moisture protective encapsulation layer 38 completely enclose the OLED devices to provide full moisture protection of these devices and to provide a corresponding increase of operational lifetime of such devices.

Openings 96 are formed through the encapsulation layer 38 to extend to the first electrode layer 36, and openings 97 are formed through the encapsulation layer 38 to extend to the second electrode layer 37. Openings 96 and 97 are provided to permit an electrical connection of the electrode layers 36, 37 to an electrical power supply for causing light emission from an OLED device, as described hereinafter with respect to FIGS. 5–8. The openings 96, 97 can be formed by conventional processes such as, for example, photolithographic processes which include a wet or dry etching step, or an ablative process.

Figure 5:
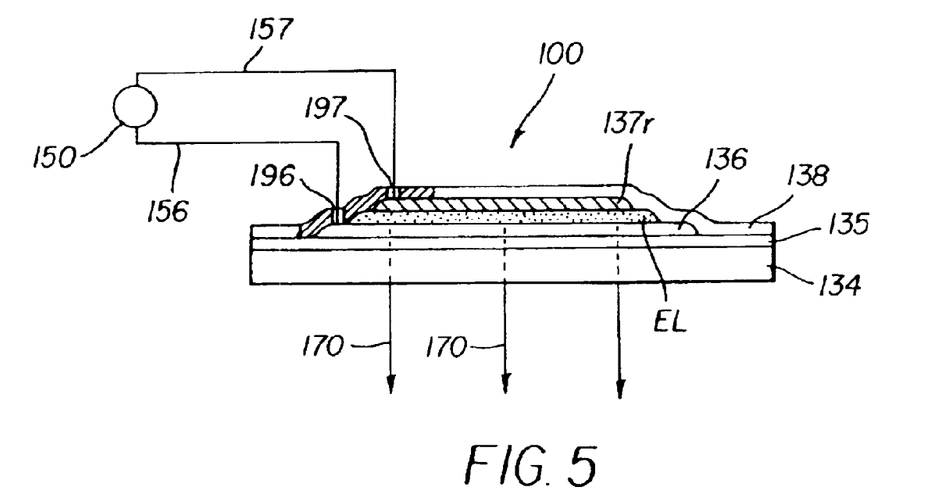
FIG. 5 shows one embodiment of a bottom-emitting OLED device having a reflective second electrode layer.

Turning to FIG. 5, a schematic side view of a bottom-emitting OLED device 100 is shown which provides emitted light 170 when a drive power supply 150 is connected via an electrical connection 156 to a light transmissive first electrode layer 136 through the opening(s) 196 in the transparent moisture protective encapsulation layer 138, and is connected via an electrical connection 157 to an reflective second electrode layer 137r through the opening(s) 197 in the encapsulation layer 138. If the reflective second electrode layer 137r is the cathode and the light transmissive first electrode layer 136 is the anode of the device, emitted light 170 will be generated whenever the drive power supply 150 provides a more positive electrical potential to such anode with respect to such cathode.

The light transmissive flexible substrate 134 corresponds to the light transmissive flexible substrate 34 described with reference to FIGS. 1, 2A, 2B, 3A–3D, and 4A, 4B. Similarly, the moisture barrier layer 135 corresponds to the moisture barrier layer 35. Other corresponding numeral designations are 136 and 36, 137r and 37r, and 138 and 38, respectively.

Figure 6:
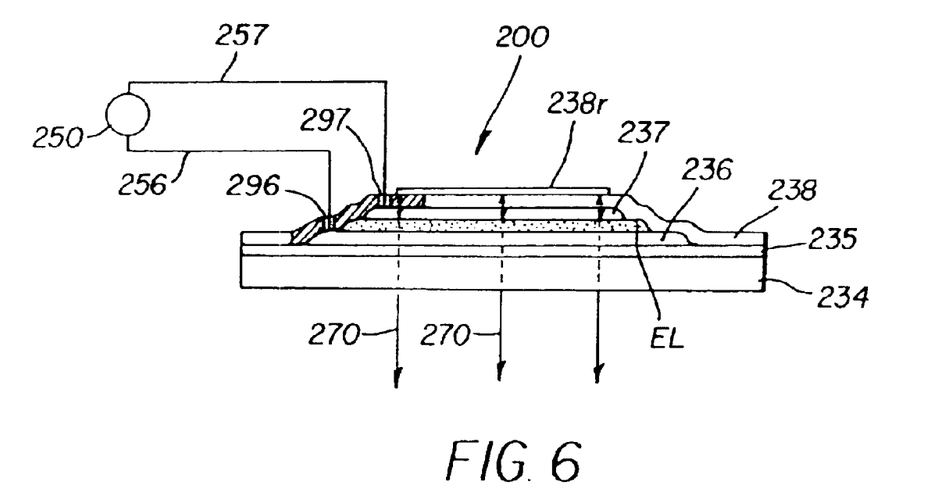
FIG. 6 shows another embodiment of a bottom-emitting OLED device having a reflective layer disposed over a central portion of the transparent encapsulation layer.

Turning to FIG. 6, a schematic side view of another embodiment of a bottom-emitting OLED device 200 is shown which provides emitted light 270. The OLED device 200 differs from the device 100 of FIG. 5 in that a reflective layer 238r is disposed over a central portion of the transparent moisture protective encapsulation layer 238. The reflective layer 238r can receive a portion of light emitted within the EL medium structure in an upwardly direction through the light transmissive second electrode layer 237, and can reflect such light in a downwardly direction so as to provide the composite of the bottom emitted light 270.

Corresponding numeral designations are used to designate corresponding elements. For example, the light transmissive flexible substrate 234 and the transparent moisture barrier layer 235 correspond to the flexible substrate 34 and to the moisture barrier layer 35, respectively, described with reference to FIGS. 1, 2A, 2B, 3A–3D, and 4A, 4B.

Figure 7:
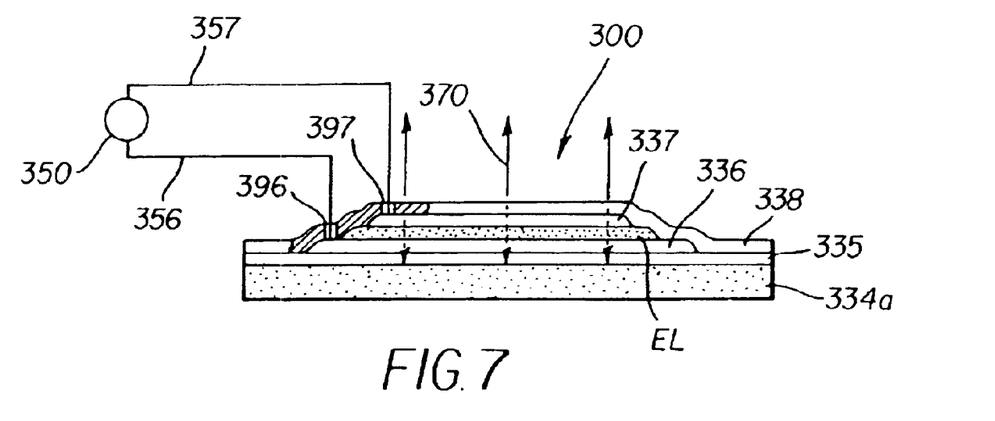
FIG. 7 shows an embodiment of a top-emitting OLED device having light transmissive first and second electrodes and an absorptive flexible substrate.
Figure 8:
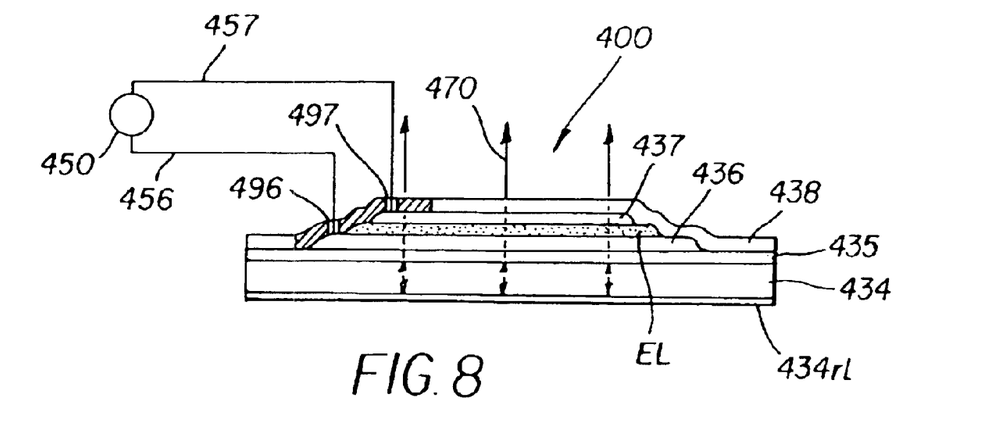
FIG. 8 shows another embodiment of a top-emitting OLED device having light transmissive first and second electrodes and a light transmissive flexible substrate which includes a reflective layer over an exterior substrate surface.

FIG. 7 and FIG. 8 are schematic side views of two embodiments of top-emitting OLED devices 300 and 400, respectively, having light transmissive first and second electrode layers 336 (436) and 337 (437), respectively.

The absorptive flexible substrate 334a of the OLED device 300 of FIG. 7 corresponds to the absorptive flexible substrate 34a described with reference to FIG. 2C. The substrate 334a substantially absorbs the portion of light emitted within the EL medium structure in a downwardly direction through the light transmissive first electrode layer 336 and through the transparent moisture barrier layer 335. Upwardly directed light emission exits the device as emitted light 370.

Corresponding parts or elements are shown with corresponding numeral designations. For example, the openings 396 (496) and 397 (497) correspond to the openings 96 and 97, respectively, described with reference to FIGS. 4A, 4B.

The OLED device 400 of FIG. 8 provides top emitted light 470. A reflective layer 434rl is provided over a lower surface of the light transmissive flexible substrate 434, and the transparent moisture barrier layer 435 is formed over an opposing substrate surface. A corresponding reflective layer 34rl, light transmissive flexible substrate 34, and transparent moisture barrier layer 35 have been described with reference to FIG. 2D.

One advantage of the present invention is that a plurality of laterally spaced moisture protected OLED devices can be formed along an elongated direction of a flexible substrate. Individual moisture protected OLED devices can be readily provided by simply cutting the flexible support and associated layers within zones defined by the lateral spacing between OLED devices.

The invention has been described in detail with particular reference to certain preferred embodiments thereof, but it will be understood that variations and modifications can be effected within the spirit and scope of the invention.

Parts List 20 apparatus for forming a moisture barrier layer or a moisture protective encapsulation layer
20H housing
20C chamber
22 vacuum pump
23 vacuum pump control valve
24 pressure monitor
26 entrance port
28 exit port
30 supply reel
32 tension clutch
33 enclosure
34 light transmissive flexible substrate
34a absorptive flexible substrate
34rl reflective layer on lower substrate surface
34ru reflective layer on upper substrate surface
35 transparent moisture barrier layer
36 light transmissive first electrode layer
36r reflective first electrode layer
37 light transmissive second electrode layer
37r reflective second electrode layer
38 transparent moisture protective encapsulation layer
39 idler rollers
40 take-up reel
41 take-up reel drive motor
44 optional enclosure
46 motor speed controller
50 heat lamps
60 oxidizing gas supply (O)
62 pressure adjustment valve
70 metal-organic gas supply (MO)
72 pressure adjustment valve
80 inert gas purging supply (IG)
82 pressure adjustment valve
96 opening(s) through encapsulation layer to first electrode layer
97 opening(s) through encapsulation layer to second electrode layer
EL organic electroluminescent medium structure
1, 2, 3, 4, 5, ... n−1, n pass(es) of flexible substrate between idler rollers (39) in chamber (20C) wherein n is an integer
O1, O2, ... O(m−1), Om oxidizing gas processing station(s) wherein m is an integer
MO1, MO2, ... MO(m−1), Om metal-organic gas processing station(s) wherein m is an integer
IGN1, IGN2, ... IGNm inert gas nozzle(s) wherein m is an integer
100 bottom-emitting OLED device
134 light transmissive flexible substrate
135 transparent moisture barrier layer
136 light transmissive first electrode layer
137r reflective second electrode layer
138 transparent moisture protective encapsulation layer
150 drive power supply
156 electrical connection
157 electrical connection
170 emitted light
196 opening(s) through encapsulation layer to first electrode layer
197 opening(s) through encapsulation layer to second electrode layer
200 alternative configuration of a bottom-emitting OLED device
234 light transmissive flexible substrate
235 transparent moisture barrier layer
236 light transmissive first electrode layer
237 light transmissive second electrode layer
238 transparent moisture protective encapsulation layer
238r reflective layer over a central portion of the encapsulation layer
250 drive power supply
256 electrical connection
257 electrical connection
270 emitted light
296 opening(s) through encapsulation layer to first electrode layer
297 opening(s) through encapsulation layer to second electrode layer
300 top-emitting OLED device
334a absorptive flexible substrate
335 transparent moisture barrier layer
336 light transmissive first electrode layer
337 light transmissive second electrode layer
338 transparent moisture protective encapsulation layer
350 drive power supply
356 electrical connection
357 electrical connection
370 emitted light
396 opening(s) through encapsulation layer to first electrode layer 397 opening(s) through encapsulation layer to second electrode layer
400 alternative configuration of a top-emitting OLED device
434 light transmissive flexible substrate
434rl reflective layer over lower substrate surface
435 transparent moisture barrier layer
436 light transmissive first electrode layer
437 light transmissive second electrode layer
438 transparent moisture protective encapsulation layer
450 drive power supply
456 electrical connection
457 electrical connection
470 emitted light
496 opening(s) through encapsulation layer to first electrode layer
497 opening(s) through encapsulation layer to second electrode layer

What is claimed is:

1. A method of forming a transparent moisture barrier layer in direct contact with a flexible substrate on which can be formed an OLED device, comprising the steps of:
    a) providing a vacuum chamber;
    b) disposing within the vacuum chamber a repeating series of stations including at least two spaced apart processing stations and an intermediate purging station disposed between the two processing stations and wherein the two processing stations include different gases which react with the substrate to form a portion of the moisture barrier layer, the purging station having a purging gas disposed between the processing stations and directed to impinge upon the substrate to separate the two different gases in the processing stations; and
    c) moving the flexible substrate along a path in the vacuum chamber past the repeating stations which form the moisture barrier layer on the substrate.

2. The method of claim 1 further including repeating steps b) and c) in the same or a different vacuum chamber to form a transparent moisture protective encapsulation layer over the OLED device and over the moisture barrier layer.

3. The method of claim 1 wherein the gases in the processing stations include ozone, trimethylaluminum, and nitrogen.

4. The method of claim 1 wherein the gases form a transparent dielectric oxide layer.

5. The method of claim 4 wherein the transparent dielectric oxide layer includes aluminum oxide, silicon dioxide, aluminum titanium oxide, tantalum oxide, hafnium oxide, or zirconium oxide.

6. The method of claim 2 further including providing openings through the encapsulation layer to permit electrical connections to the OLED device.

7. Apparatus for forming a transparent moisture barrier layer in direct contact with a flexible substrate on which can be formed an OLED device in a vacuum chamber, comprising:
    a) a repeating series of stations including at least two spaced apart processing stations and an intermediate purging station disposed within the vacuum chamber between the two processing stations and wherein the two processing stations include different gases which react with the substrate to form a portion of the moisture barrier layer, the purging station having a purging gas disposed between the processing stations and directed to impinge upon the substrate to separate the two different gases in the processing stations;
    b) means for moving the flexible substrate along a path in the vacuum chamber past the repeating stations; and
    c) means for controlling the operation of the repeating series of stations to form the moisture barrier layer on the substrate.

8. The apparatus of claim 7 wherein the processing stations and the intermediate purging station are disposed in the same or a different vacuum chamber to form a transparent moisture protective encapsulation layer over the OLED device and over the moisture barrier layer.

9. The apparatus of claim 7 wherein the gases in the processing stations include ozone, trimethylaluminum, and nitrogen.

10. The apparatus of claim 7 wherein the gases form a transparent dielectric oxide layer.

11. The apparatus of claim 10 wherein the transparent dielectric oxide layer includes aluminum oxide, silicon dioxide, aluminum titanium oxide, tantalum oxide, hafnium oxide, or zirconium oxide.

* * * * *